US010777248B1

(12) United States Patent
Mihajlovic et al.

(10) Patent No.: US 10,777,248 B1
(45) Date of Patent: Sep. 15, 2020

(54) HEAT ASSISTED PERPENDICULAR SPIN TRANSFER TORQUE MRAM MEMORY CELL

(71) Applicant: WESTERN DIGITAL TECHNOLOGIES, INC., San Jose, CA (US)

(72) Inventors: Goran Mihajlovic, San Jose, CA (US); Neil Smith, San Jose, CA (US); Michael Grobis, Campbell, CA (US); Michael Tran, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/459,389

(22) Filed: Jul. 1, 2019

Related U.S. Application Data

(60) Provisional application No. 62/865,830, filed on Jun. 24, 2019.

(51) Int. Cl.
 *G11C 11/16* (2006.01)
 *H01F 10/32* (2006.01)
 (Continued)

(52) U.S. Cl.
 CPC ........ *G11C 11/161* (2013.01); *G11C 11/1673* (2013.01); *G11C 11/1675* (2013.01);
 (Continued)

(58) Field of Classification Search
 CPC ............. G11C 11/161; G11C 11/1673; G11C 11/1675; H01F 10/329; H01F 10/3254; H01F 10/3286; H01L 27/222; H01L 43/02
 See application file for complete search history.

(56) References Cited

U.S. PATENT DOCUMENTS

| 7,973,349 B2 | 7/2011 | Huai |
| 8,593,863 B2 | 11/2013 | Choi |
| | (Continued) | |

FOREIGN PATENT DOCUMENTS

JP 2008252036 10/2008

OTHER PUBLICATIONS

Apalkov, et al., "Magnetoresistive Random Access Memory," Proceedings of the IEEE, Institute of Electrical and Electronics Engineers, Oct. 2016, 104, pp. 1796-1830. DOI: 10.1109/JPROC.2016.2590142.
(Continued)

*Primary Examiner* — David Lam
(74) *Attorney, Agent, or Firm* — Vierra Magen Marcus LLP

(57) ABSTRACT

A magnetoresistive random access memory (MRAM) memory cell comprises a pinned layer having fixed direction of magnetization that is perpendicular to a plane of the pinned layer, a first free layer having a direction of magnetization that can be switched and is perpendicular to a plane of the first free layer, a tunnel barrier positioned between the pinned layer and the first free layer, a second free layer having a direction of magnetization that can be switched, and a spacer layer positioned between the first free layer and the second free layer. Temperature dependence of coercivity of the second free layer is greater than temperature dependence of coercivity of the first free layer.

18 Claims, 11 Drawing Sheets

(51) Int. Cl.
    *H01L 27/22*     (2006.01)
    *H01L 43/02*     (2006.01)

(52) U.S. Cl.
    CPC ....... *H01F 10/329* (2013.01); *H01F 10/3254* (2013.01); *H01F 10/3286* (2013.01); *H01L 27/222* (2013.01); *H01L 43/02* (2013.01)

(56) References Cited

U.S. PATENT DOCUMENTS

| | | |
|---|---|---|
| 9,054,300 B2 | 6/2015 | Annunziata |
| 9,166,143 B1 | 10/2015 | Gan |
| 2005/0002228 A1 | 1/2005 | Dieny |
| 2010/0072524 A1* | 3/2010 | Huai ................ B82Y 25/00 257/295 |
| 2010/0090300 A1 | 4/2010 | Xi |
| 2012/0280336 A1* | 11/2012 | Jan ................ H01L 43/12 257/421 |
| 2013/0182499 A1 | 7/2013 | Prejbeanu |

OTHER PUBLICATIONS

Mihajlovic, et al., "Origin of the resistance-area product dependence of spin transfer torque switching in perpendicular magnetic random access memory cells," Western Digital Corporation, May 8, 2019 arXiv:1905.02673 [cond-mat.mes-hall].
Tsunoda, et al., "A Novel MTJ for STT-MRAM with a Dummy Free Layer and Dual Tunnel Junctions," Electron Devices Meeting, 1988. IEDM '88. Technical Digest., International—Dec. 2012 IEEE International DOI: 10.1109/IEDM.2012.6479126.
PCT International Search Report dated Apr. 2, 2020, PCT Patent Application No. PCT/US2019/06667.

* cited by examiner

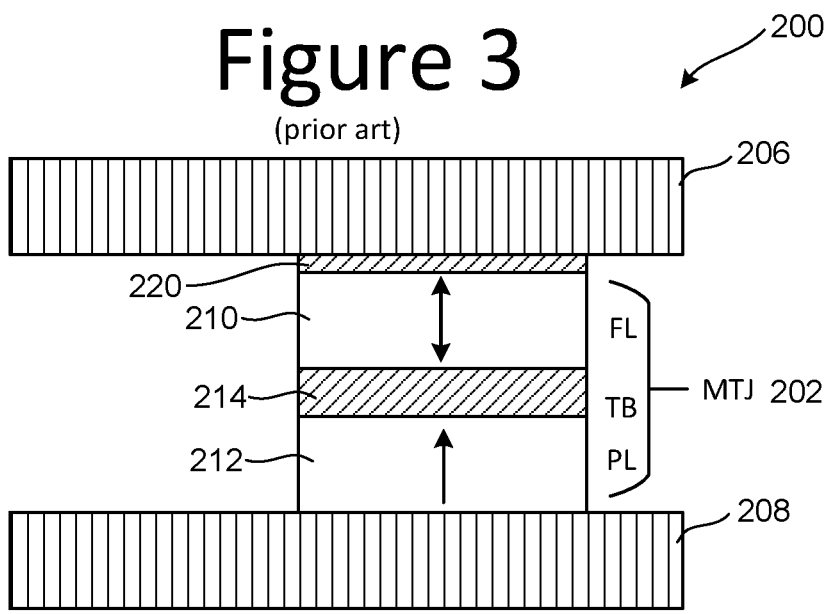
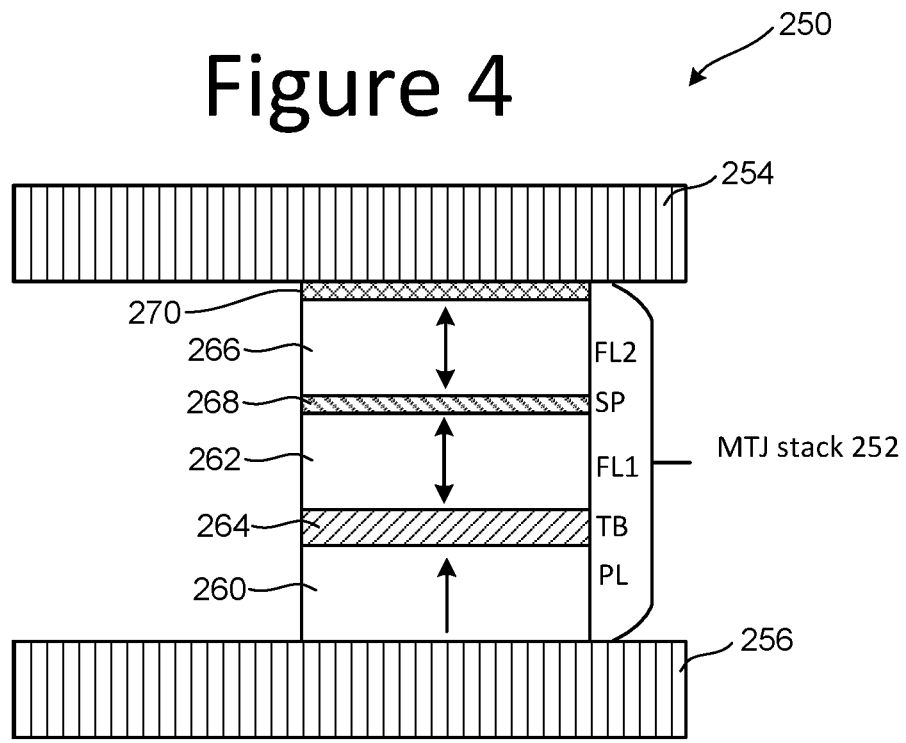

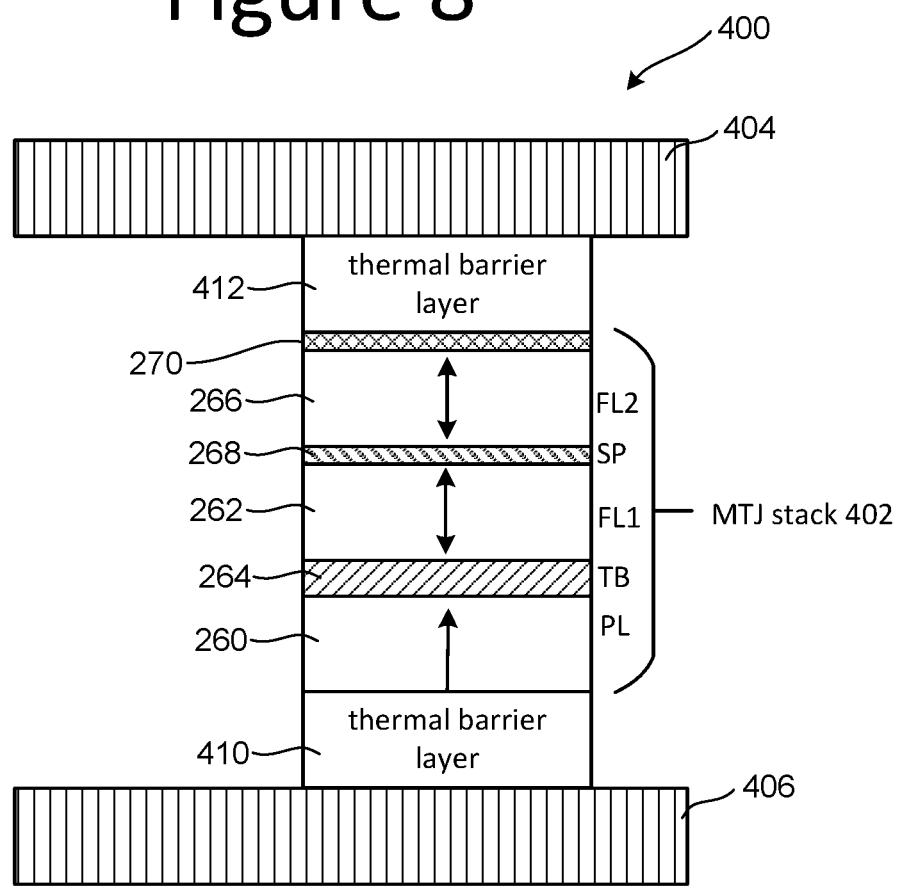

HEAT ASSISTED PERPENDICULAR SPIN TRANSFER TORQUE MRAM MEMORY CELL

This application claims priority to Provisional Application No. 62/865,830, filed on Jun. 24, 2019, titled "HEAT ASSISTED PERPENDICULAR SPIN TRANSFER TORQUE MRAM MEMORY CELL," which application is incorporated herein by reference in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, an MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, the direction of magnetization is the direction along which the magnetic moment is oriented.

Although MRAM is a promising technology, it is challenging to achieve high bit density and high endurance for write operations with existing MRAM memory cell designs.

BRIEF DESCRIPTION OF THE DRAWINGS

Like-numbered elements refer to common components in the different figures.

FIG. 3 is a block diagram of a MRAM memory cell.
FIG. 4 is a block diagram of a MRAM memory cell.
FIG. 8 is a block diagram of a MRAM memory cell.

DETAILED DESCRIPTION

Figure 1:
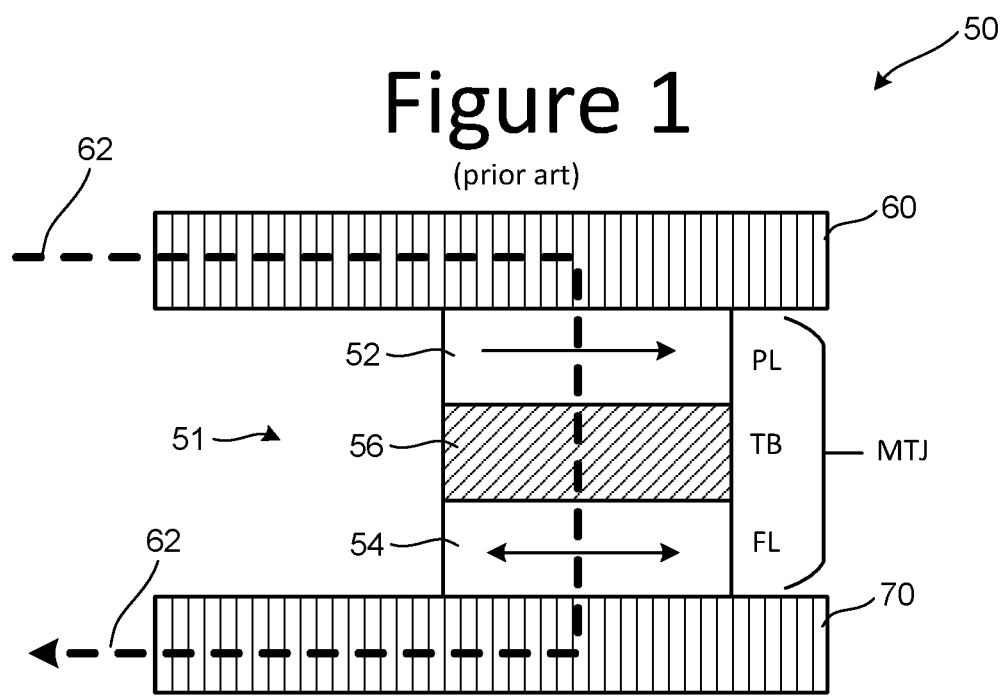
FIG. 1 is a block diagram of a MRAM memory cell.

A magnetoresistive random access memory (MRAM) memory cell is proposed that comprises a pinned layer having a fixed direction of magnetization that is perpendicular to a plane of the pinned layer, a first free layer having a direction of magnetization that can be switched and is perpendicular to a plane of the first free layer, a tunnel barrier positioned between the pinned layer and the first free layer, a second free layer having a direction of magnetization that can be switched, a spacer layer positioned between the first free layer and the second free layer, and a cap layer adjacent the second free layer. The temperature dependence of the coercivity of the second free layer is greater than the temperature dependence of the coercivity of the first free layer. The cap layer and the tunnel barrier are configured to generate heat in response to a current through the cap layer and the tunnel barrier. The second free layer is configured such that the preferred (or easy) axis of magnetization of the second free layer is changed from perpendicular to the plane of the second free layer to in-plane in response to the rise in temperature. As a consequence the direction of the magnetization of the second free layer is also changed and can acquire significant in-plane component. The first free layer is configured to switch its direction of magnetization between parallel and anti-parallel to the direction of magnetization of the pinned layer in response to spin transfer torque, self-induced heating and dipolar stray magnetic field from the second free layer having a direction of magnetization that is in-plane and/or exchange coupling between the second free layer having in-plane direction of magnetization and the first free layer. This memory cell uses a lower write current and lower write voltage, which enables the use of smaller transistors so that a high bit density can be achieved. Additionally, the lower write voltage results in an increase in the difference between write voltage and breakdown voltage, also known as write margin, which in turn improves the endurance of the aforementioned MRAM cell.

Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a first magnetic layer (usually called the fixed, pinned or reference layer), a spin-polarized current can be produced. If this spin-polarized current is directed into a second magnetic layer (often referred to as the "free layer"), angular momentum can be transferred to this second magnetic layer, changing the direction of magnetization of the second magnetic layer. This is referred to as spin transfer torque.

Spin transfer torque can be used to program or write to MRAM memory. Spin transfer torque magnetic random access memory (STT MRAM) has the advantages of lower power consumption and better scalability over traditional MRAM which uses external magnetic fields to flip the active elements. Spin transfer torque technology has the potential to make MRAM devices possible by combining low current requirements and reduced cost; however, the amount of current needed to reorient the magnetization can be too high for most commercial applications, which limits the number of bits that can be fabricated per chip area (i.e. the memory density). This is because a transistor that provides the current to the MRAM device has to be sufficiently large and thus occupy a large minimum footprint (current through the transistor scales with its size). Also, STT MRAM usually has a small write margin. The write margin is the difference between the voltage or current that causes the breakdown of the MRAM device and voltage or current that is needed to reorient the magnetization (i.e. to write the bit). If this margin is small, the number of times that one can write into an MRAM bit before it breaks down, i.e. the MRAM endurance, is also limited.

FIG. 1 is a schematic representation of an example STT MRAM memory cell 50. For purposes of this document, a memory cell is the basic unit of storage. Memory cell 50 includes a magnetic tunnel junction (MTJ) 51 comprising an upper ferromagnetic layer 52, a lower ferromagnetic layer 54, and a tunnel barrier (TB) 56, which is an insulating layer between the two ferromagnetic layers. In this example, lower ferromagnetic layer 54 is the free layer (FL) the magnetization direction of which can be switched. Upper ferromagnetic layer 52 is the pinned (or fixed) layer (PL) and its direction of magnetization remains unchanged (under normal circumstances). When the magnetization in free layer 54 is parallel to the magnetization in pinned layer PL 52, the resistance across the memory cell 50 is relatively low. When the magnetization in free layer FL 54 is anti-parallel to the magnetization in pinned layer PL 52, the resistance across memory cell 50 is relatively high. The data ("0" or "1") in memory cell 50 is read by measuring the resistance of the memory cell 50. In this regard, electrical conductors 60/70 of memory cell 50 are utilized to read the MRAM data. By design, both the parallel and antiparallel configurations remain stable in the quiescent state and/or during a read operation (at sufficiently low read current).

In the remaining text and figures, the direction of the write current is defined as the direction of the electron flow. Therefore, the term write current refers to an electron current. To "set" the MRAM memory cell bit value (i.e., choose the direction of the free layer magnetization), an electrical write current 62 is applied from conductor 60 to conductor 70. The electrons in the write current become spin-polarized as they pass through pinned layer 52 because pinned layer 52 is a ferromagnetic metal. While conduction electrons in a ferromagnetic metal will have their spin orientation collinear with the direction of magnetization, a substantial majority of them will have a particular direction that is parallel to the direction of magnetization, yielding a net spin polarized current. The electron spin refers to the angular momentum, which is directly proportional to but antiparallel in direction to the magnetic moment of the electron. Note that this directional distinction will not be used going forward for ease of discussion. When the spin-polarized electrons tunnel across the tunnel barrier 56, conservation of angular momentum can result in the imparting of a torque on both free layer 54 and pinned layer 52; however this torque is inadequate (by design) to affect the magnetization direction of the pinned layer. Contrastingly, this torque is (by design) sufficient to switch the magnetization orientation in the free layer 54 to become parallel to that of the pinned layer 52 if the initial magnetization orientation of the free layer 54 was antiparallel to the pinned layer 52. The parallel magnetizations will then remain stable before and after such write current is turned off. In contrast, if free layer 54 and pinned layer 52 magnetizations are initially parallel, the free layer magnetization can be STT switched to become antiparallel to the pinned layer 52 by application of a write current of opposite direction to the aforementioned case. Thus, by way of the same STT physics, the direction of the magnetization of free layer 54 can be deterministically set into either of two stable orientations by judicious choice of the write current direction (polarity).

Figure 2:
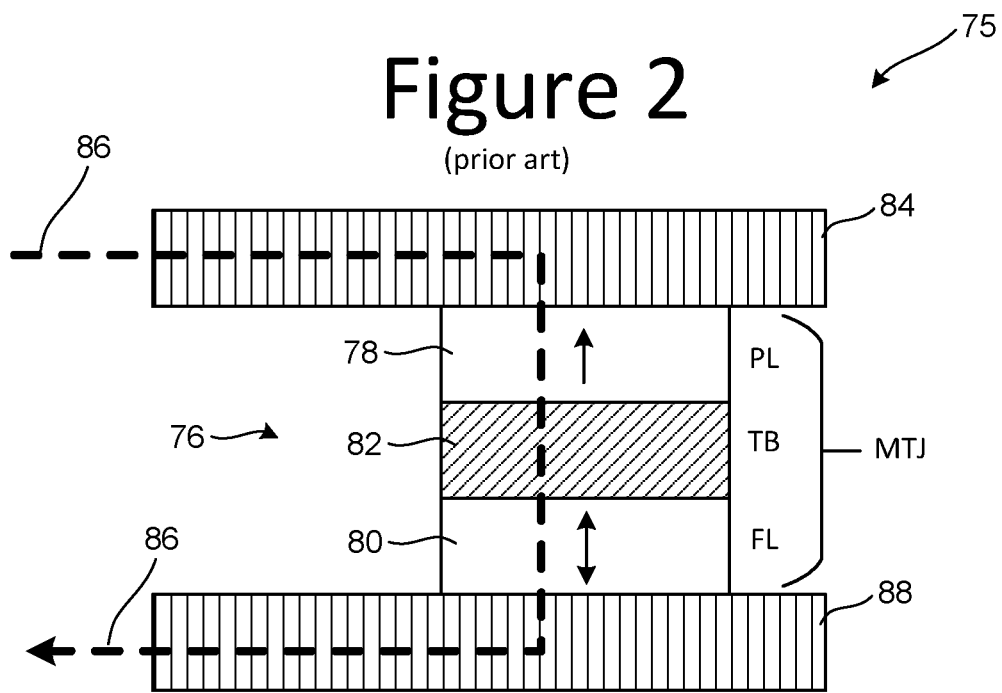
FIG. 2 is a block diagram of a MRAM memory cell.

The MRAM memory cell of FIG. 1 uses materials in which both the pinned and free layer magnetizations are in the in-plane direction. In contrast, FIG. 2 depicts a schematic representation of a STT switching MRAM memory cell 75 in which both the pinned and free layer magnetization are in the perpendicular direction (i.e. perpendicular to the plane defined by the free layer and perpendicular to the plane defined by the pinned layer). Memory cell 75 includes a magnetic tunnel junction (MTJ) 76 comprising an upper ferromagnetic layer 78, a lower ferromagnetic layer 80, and a tunnel barrier (TB) 82 which is an insulating layer between the two ferromagnetic layers. In this example, lower ferromagnetic layer 80 is the free layer FL and the direction of its magnetization can be switched. Upper ferromagnetic layer 78 is the pinned (or fixed) layer PL and the direction of its magnetization is not changeable. When the magnetization in free layer 80 is parallel to the magnetization in pinned layer PL 78, the resistance across the memory cell 75 is relatively low. When the magnetization in free layer FL 80 is anti-parallel to the magnetization in pinned layer PL 78, the resistance across memory cell 75 is relatively high. The data ("0" or "1") in memory cell 75 is read by measuring the resistance of the memory cell 75. In this regard, electrical conductors 84/88 of memory cell 75 are utilized to read the MRAM data. By design, both the parallel and antiparallel configurations remain stable in the quiescent state and/or during a read operation (at sufficiently low read current). To "set" the MRAM cell bit value (i.e., choose the direction of the free layer magnetization), an electrical write current 86 is applied from conductor 84 to conductor 88 and the memory cell operates as discussed above with respect to FIG. 1.

Compared to the earliest MRAM cells which used magnetic fields from current carrying conductors proximate to the MRAM cell, the STT switching technique requires relatively low power, virtually eliminates the problem of adjacent bit disturbs, and has more favorable scaling for higher memory cell densities (reduced MRAM cell size). The latter issue also favors STT MRAM where the free and pinned layer magnetizations are orientated perpendicular to the film plane, rather than in-plane.

FIG. 3 depicts a schematic representation of another example of a STT-switching MRAM memory cell 200 in which both the pinned and free layer magnetization are in the perpendicular direction. Memory cell 200 includes a magnetic tunnel junction (MTJ) 202 comprising an upper ferromagnetic layer 210, a lower ferromagnetic layer 212, and a tunnel barrier (TB) 214 serving as an insulating layer between the two ferromagnetic layers. In this example, upper ferromagnetic layer 210 is the free layer FL and the direction of its magnetization can be switched. Lower ferromagnetic layer 212 is the pinned (or fixed) layer PL and the direction of its magnetization is not changed. Memory cell 200 also includes a cap layer 220 that is adjacent to MTJ 202 (e.g., adjacent to free layer 210). Cap layer 220 is used in order to provide additional perpendicular anisotropy to the free layer 210. In the past, cap layer 220 has been implemented so that its resistance is small compared to the resistance of the tunnel barrier 214, which dominates the resistance of the MRAM memory cell.

Some challenges to developing memory systems that use STT MRAM include reducing the switching current and increasing the write margin. For example, switching from the state where the direction of magnetization of the free layer is parallel to the direction of magnetization of the pinned layer to the state where the direction of magnetization of the free layer is anti-parallel to the direction of magnetization of the pinned layer uses a larger write current. In general, it is desired to have a lower write current, i.e., the current applied to the memory cell to change the direction of magnetization of the free layer. For memory systems using a transistor (e.g., a NMOS transistor) to connect the word line (or other control line) to the memory cell, a larger write current requires a larger transistor which results in less room available for memory cells and, thus, a lower density memory array (equivalent to lower memory capacity for the given memory chip area).

The write margin is defined as the difference between the write voltage (the voltage applied to the memory cell to change the direction of magnetization of the free layer) and the breakdown voltage for the memory cell. The greater the write margin, the higher is the endurance of the memory cell (i.e. the number of times that cell can be written into reliably).

According to the STT MRAM macrospin theory, the write voltage depends linearly on the resistance area product ("RA") of the MRAM cell. The total RA for the memory cell is equal to the sum of RAs of all of its layers, including also the contribution from interfacial resistances between different layers. However, the RA of tunnel barrier and the RA of the cap layer, the former and (usually) the latter being the high resistivity insulating material, are much larger than those of other layers and interfaces between them (which are made of low resistivity metals) and the RA of the latter (metallic layers) can be neglected. However, due to spin-polarized tunneling, the RA of the tunnel barrier itself depends on the relative magnetization orientations of pinned layer and free layer adjacent to it, with $RA_P$ for the parallel magnetization state being considerably lower than $RA_{AP}$ in the anti-parallel state. By convention, a cited value for RA of a tunnel barrier will (unless stated otherwise) refer to the quantity $RA_P$. Therefore, when an STT MRAM memory cell has a cap layer, the total RA for the memory cell is equal to the sum of $RA=RA_P$ of the tunnel barrier and the RA of the cap layer.

The critical bias voltage $V_b$ required to switching the free layer of an STT MRAM cell from the parallel to antiparallel state, referred to here as $V_c^{P \to AP}$, is approximately described as the solution to the following (quadratic) equation:

$$0 = H_{c0} + H_{RL} + \frac{\tau}{\alpha} \frac{V_c^{P \to AP}}{RA} + \varepsilon V_c^{P \to AP} - \varsigma \frac{(V_c^{P \to AP})^2}{RA} \quad \text{Equation (1)}$$

where:
$H_{c0}$ is the coercivity of the free layer at room temperature without voltage bias;
$H_{RL}$ is the stray dipolar field from the reference layer (one expects $H_{RL} \ll H_{c0}$);

$$\frac{\tau}{\alpha}$$

is a spin transfer torque coefficient;
$RA=RA_P$ is the resistive area product of the memory cell in the parallel state;
$\varepsilon$ is a Voltage-Controlled-Magnetic-Anisotropy (VCMA) coefficient
The coefficient $$\varsigma = (R_{th}A)\left|\frac{dH_c}{dT}\right| > 0$$

accounts for Joule (self) heating of the MRAM cell due to the passage of current through the cell during the write/switching process. $R_{th}A$ is the effective thermal resistance-area product of the cell, and $$\frac{dH_c}{dT}$$

is the change in coercivity per change in temperature (generally, $$\frac{dH_c}{dT} < 0$$

is a negative quantity, as is assumed here).

For the contrasting case of switching the free layer of an STT MRAM cell from the antiparallel to parallel state, the critical switching voltage $V_c^{AP \to P}$, is now approximately described as the solution to a somewhat different quadratic equation:

$$0 = -H_{c0} + H_{RL} + \frac{\tau}{\alpha} \frac{V_c^{AP \to P}}{RA} - \varepsilon V_c^{AP \to P} + \varsigma \frac{(V_c^{AP \to P})^2}{RA'} \quad \text{Equation (2)}$$

$$\text{where } RA'=RA(1+TMR)(1-0.5|V_c^{AP \to P}|) \quad \text{Equation (3)}$$

where $$TMR = \left.\frac{RA_{AP} - RA_P}{RA_P}\right|_{V=0}$$

is zero-bias tunneling magnetoresistance. The expression in equation 3 for RA' is an empirical approximation to accounts for the voltage bias dependence of the anti-parallel RA-product $RA_{AP}(V_b)$ which effects the Joule heating term.

When considering just the primary spin-torque terms $$\frac{\tau}{\alpha} \frac{V_c^{P \to AP}}{RA}$$

in Equations 1, 2, one finds that $V_c^{P \to AP} \sim -V_c^{AP \to P}$, and both $V_c^{P \rightleftarrows AP}$ are proportional to RA. Upon further inclusion of the self-heating terms $$\frac{V^2}{RA},$$

it follows that 1) the Joule heating contributions will reduce both $|V_c^{P \rightleftarrows AP}|$, and 2) the reduction will be greater for larger RA. The presence of the (typically small) VCMA term $\varepsilon V$ does not alter these conclusions. It is desirable to lower $|V_c^{P \rightleftarrows AP}|$ because it enhances the margin between $|V_c|$ and the breakdown voltage, which improves endurance and reliability. The effects of self-heating can be exploited by increasing any combination of RA, thermal barrier resistance ($R_{th}A$), or temperature dependence of coercivity The inventors have found that $\left|\frac{dH_c}{dT}\right|$ can be tailored by choosing an appropriate material or composition of materials for a free layer.

FIG. 4 depicts a schematic representation of a proposed STT MRAM memory cell 250 that has a free layer engineered to improve the benefit of self-heating. Memory cell 250 includes a magnetic tunnel junction stack 252 positioned between (and electrically connected to) conductors 254 and 256. In one embodiment, one of conductor 254 and conductor 256 is a bit line and the other is a word line. Magnetic tunnel junction stack 252 comprises a vertical stack of layers that includes pinned layer (PL) 260 at the bottom of the stack, a first free layer (FL1) 262, a tunnel barrier 264 positioned between pinned layer 260 and first free layer 262, a second free layer (FL2) 266, a spacer layer (SP) 268 positioned between first free layer 262 and second free layer 266, and a cap layer 270 positioned between second free layer 266 and conductor 254.

Pinned layer 260 has a fixed direction of magnetization which is perpendicular to the plane of the pinned layer 260. First free layer 262 has a direction of magnetization that can be switched and is perpendicular to a plane of first free layer 262. Second free layer 266 has a direction of magnetization that can be switched and is perpendicular to a plane of the second free layer 266. The direction of magnetization of first free layer 262 can be switched between directions parallel and/or anti-parallel to the direction of magnetization of pinned layer 260. The direction of magnetization of second free layer 266 can be switched between directions parallel and/or anti-parallel to the direction of magnetization of pinned layer 260. When the magnetization of first free layer 262 and second free layer 266 are parallel to the magnetization of pinned layer 260, the resistance across the memory cell 250 is relatively low. When the magnetization of first free layer 262 and second free layer 266 are anti-parallel to the magnetization in pinned layer 260, the resistance across memory cell 250 is relatively high. The data ("0" or "1") in memory cell 250 is read by measuring the resistance of the memory cell 250. In this regard, electrical conductors 254/256 (e.g., metal) attached to memory cell 250 are utilized to read the MRAM data. By design, both the parallel and antiparallel configurations remain stable in the quiescent state and/or during a read operation (at sufficiently low read current).

In one embodiment, first free layer 262 and second free layer 266 are coupled ferromagnetically through a thin spacer layer 268. This coupling includes passive coupling through dipolar magnetic fields, and in some embodiments, additional exchange coupling, either direct or indirect (e.g., via Ruderman-Kittel-Kasuya-Yosida (RKKY) interaction). In one embodiment, at maximum stand-by temperature (~85 C) and no electrical current, first free layer 262 and second free layer 266 have enough perpendicular anisotropy to remain magnetized perpendicularly. In addition, their mutual ferromagnetic coupling will help increase their thermal stability.

Perpendicular anisotropy of second free layer 266 is optimized to nave larger $\left|\frac{dH_c}{dT}\right|$ ( $\frac{dH_c}{dT}$ being negative) than first free layer 262 so that $H_c$ of second free layer 266 can be substantially lowered (possibly to zero) by self-heating of the MRAM cell above a stand-by temperature (up to 125-200 C) while first free layer 262 maintains a substantial, non-zero $H_c$. This could be achieved by having Ta spacer, instead of W spacer, adjusting cap layer on second free layer 266 or by some other materials optimization.

In one embodiment, tunnel barrier 264 is made of Magnesium Oxide (MgO); however, other materials can also be used. First free layer 262 is a ferromagnetic metal that possess the ability to change/switch its direction of magnetization. Multilayers based on transition metals like Co, Fe and their alloys can be used to form first free layer 262. In one embodiment, first free layer 262 comprises an alloy of Cobalt, Iron and Boron. Pinned layer 260 can be many different types of materials including (but not limited to) multiple layers of Cobalt and Platinum and/or an alloy of Cobalt and Iron. Spacer layer 268 can be a thin oxide (e.g., MgO, $AlO_2$, $SiO_2$, $HfO_2$) or a metal (e.g., Ru, Ir, Cu, Ta, W, Mo, Nb, Zr). Second free layer 266 can be a multi-layer perpendicular anisotropy ferromagnet (e.g., [Co/Pt]N, [Co/Ni]N, etc.). First free layer 262 and second free layer 266 are coupled through dipolar interaction and/or interlayer exchange coupling (e.g., RKKY). Cap layer 270, which can be a thin oxide (e.g., MgO, $AlO_2$, $SiO_2$, $HfO_2$, GeO, SnO, SiC, SiN), amorphous semiconductor (e.g. Si, Ge, C, CN), or metal (e.g., Ru, Ir, Cu, Ta, W, Mo, Nb, Zr, Al, Hf, TiN, TaN).

Various potential free layer structures can be implemented to achieve that second free layer 266 loses most or all of its net perpendicular anisotropy at lower T than first free layer 262:

(a) the spacer layer can be used to exchange decouple first free layer 262 and second free layer 266 (such as W, Ta, Mo, Hf, Bi or similar) while cap layer 270 can have different thickness compared to tunnel barrier 264;

(b) first free layer 262 and second free layer 266 themselves can have different thicknesses;

(c) first free layer 262 and second free layer 266 can use different magnetic composition materials; and (d) first free layer 262 and second free layer 266 can have additional inserted spacer layers that can be from different materials (e.g. W in first free layer 262 and Ta in second free layer 266) to generate different $\frac{dH_c}{dT}$.

Figure 5A:
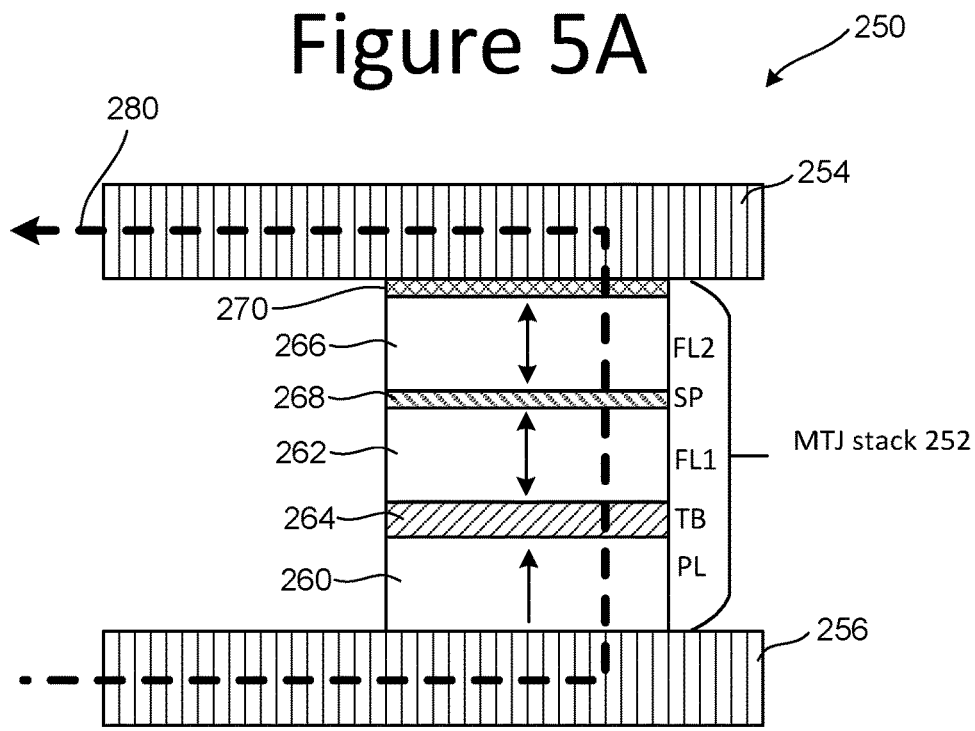
FIG. 5A is a block diagram of a MRAM memory cell.

To "set" the MRAM memory cell bit value (i.e., choose the direction of the free layer magnetization), an electrical write current 280 is applied from conductor 256 to conductor 254, as depicted in FIG. 5A. The electrons in the write current 280 become spin-polarized as they pass through pinned layer 260 because pinned layer 260 is a ferromagnetic metal. When the spin-polarized electrons tunnel across tunnel barrier 264, conservation of angular momentum can result in the imparting of a spin transfer torque on free layers 262/266 and pinned layer 260, but this torque is inadequate (by design) to affect the magnetization direction of the pinned layer 260. Contrastingly, this spin transfer torque is (by design) sufficient to switch the magnetization orientation in the free layers 262/266 to become parallel to that of the pinned layer 260 if the initial magnetization orientation of the free layer 262 was antiparallel to the pinned layer 260. The parallel magnetizations will then remain stable before and after such write current is turned off.

Figure 5B:
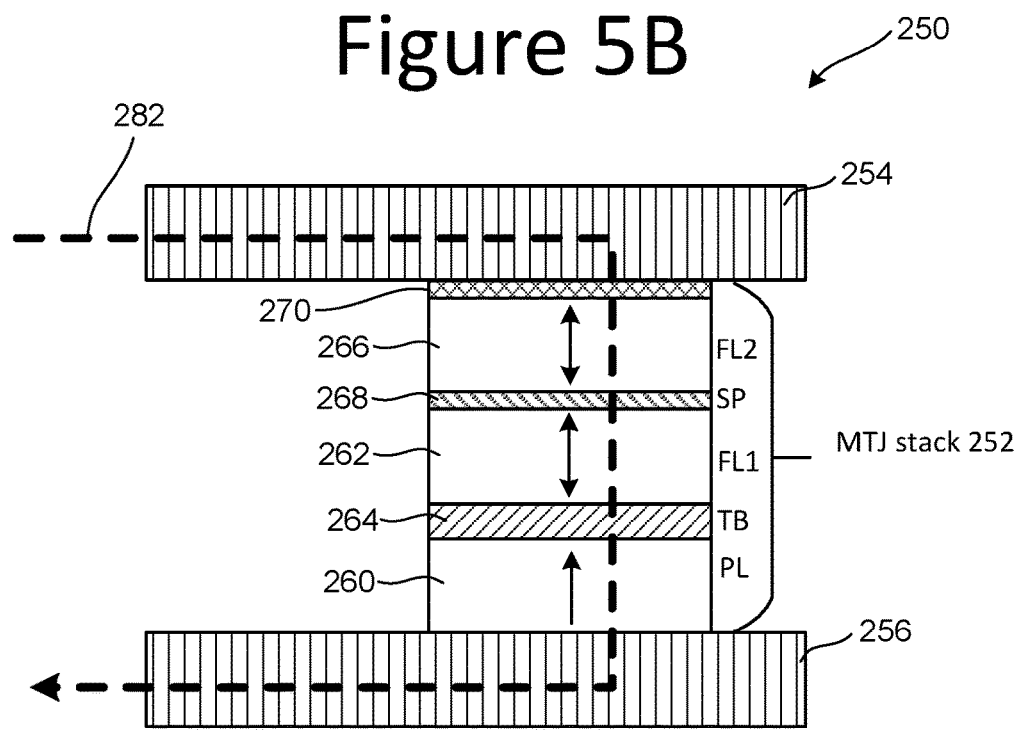
FIG. 5B is a block diagram of a MRAM memory cell.

In contrast, if first free layer 262 and pinned layer 260 magnetizations are initially parallel, the direction of magnetization of free layers 262/266 can be switched to become antiparallel to the pinned layer 260 by application of a write current of opposite direction to the aforementioned case. For example, write current 282 is applied from conductor 254 to conductor 256, as depicted in FIG. 5B. Thus, by way of the same STT physics, the direction of the magnetization of free layers 262/266 can be deterministically set into either of two stable orientations by judicious choice of the write current direction (polarity).

Figure 5C:
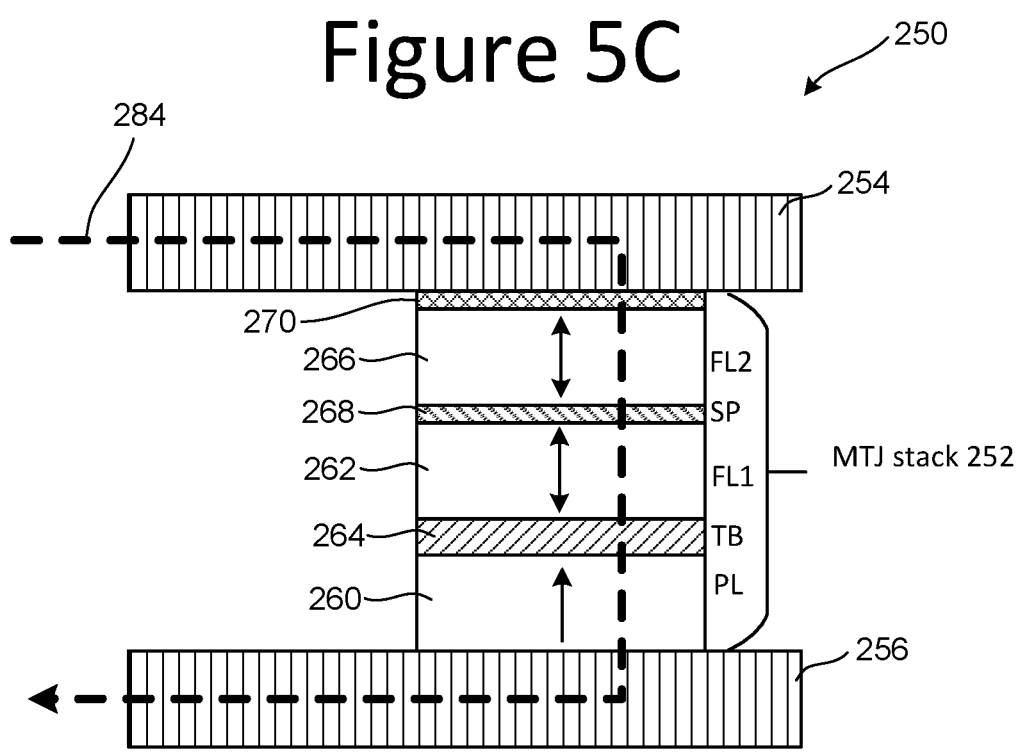
FIG. 5C is a block diagram of a MRAM memory cell.

FIG. 5C depicts memory cell 250 during a reading operation. The data ("0" or "1") in memory cell 250 is read by measuring the resistance of the memory cell 250. Low resistance typically represents a "0" bit and high resistance typically represents a "1" bit. FIG. 5B shows a read current 284 being applied across the memory cell (e.g., across the magnetic tunnel junction stack 252) by applying the read current 284 from conductor 254 to conductor 256. Alternatively, the read current 284 can be applied from conductor 256 to conductor 254.

Figure 6A:
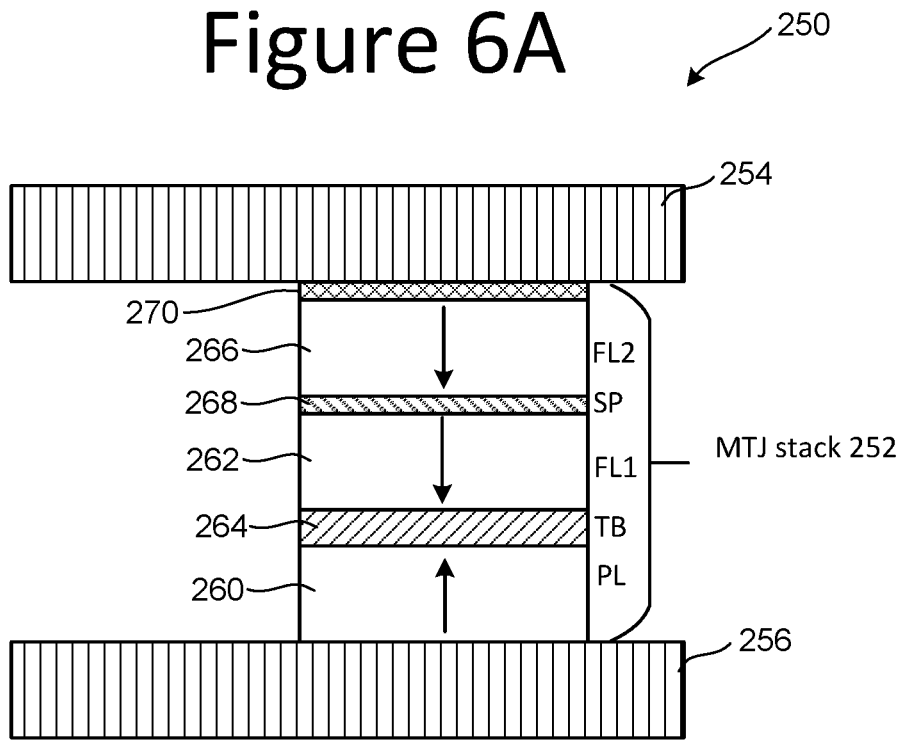
FIG. 6A is a block diagram of a MRAM memory cell.
Figure 6B:
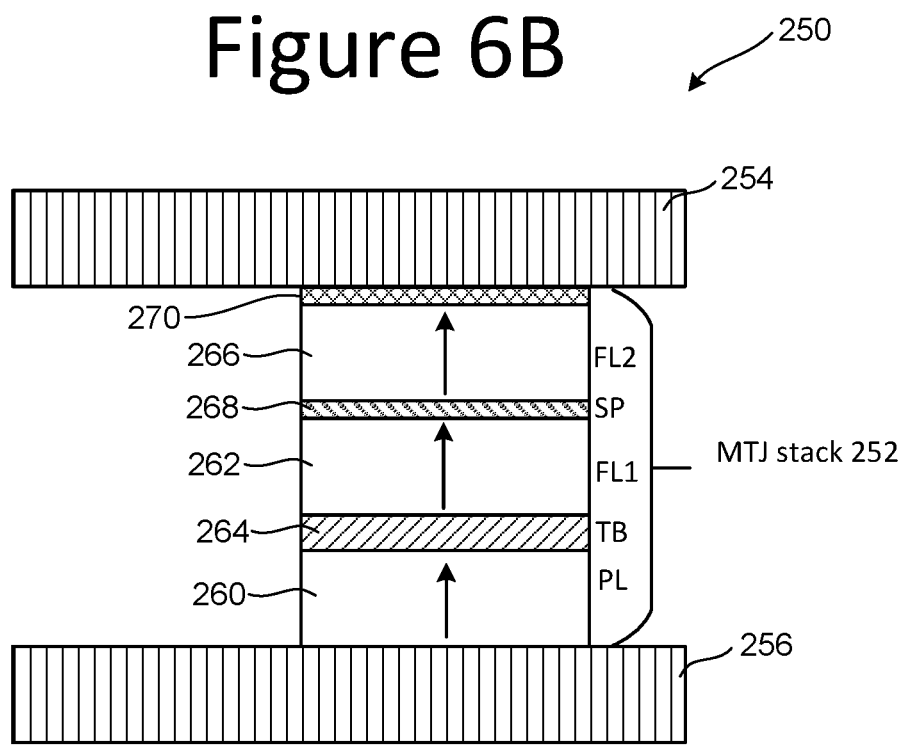
FIG. 6B is a block diagram of a MRAM memory cell.
Figure 6C:
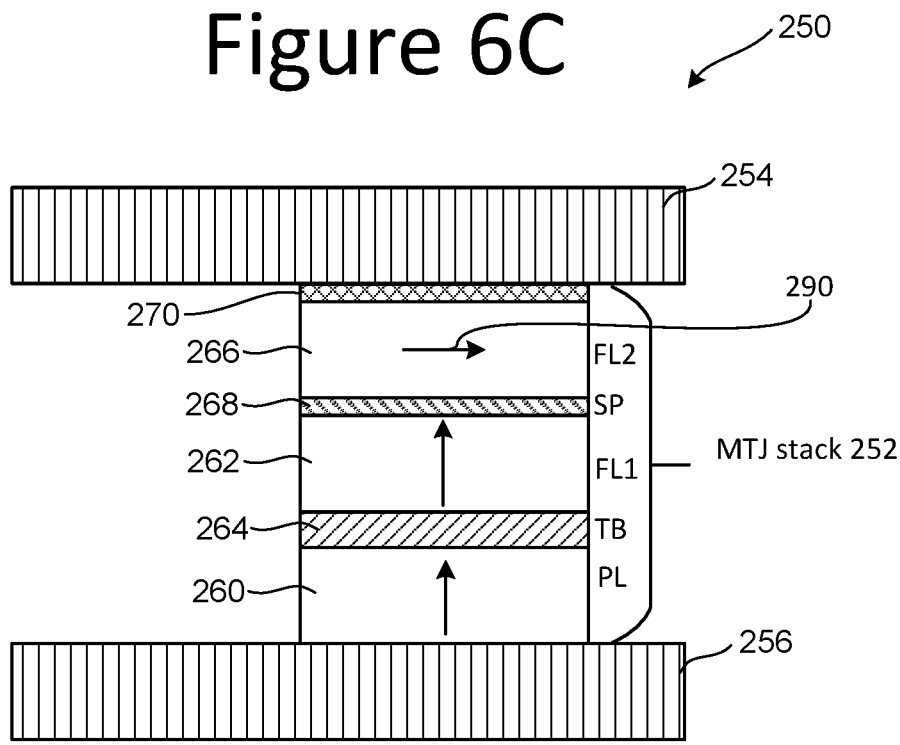
FIG. 6C is a block diagram of a MRAM memory cell.

As mentioned above, the effects of self-heating assist in the switching of direction of magnetization. These effects are improved by engineering the first free layer 262 and the second free layer 266 such that $$\left|\frac{dH_c}{dT}\right|$$

for second free layer 266 is larger than $$\left|\frac{dH_c}{dT}\right|$$

for first free layer 262. This effects of self-heating are illustrated by FIGS. 6A-D. FIG. 6A shows memory cell 254 in an idle state (no voltage bias and at room temperature) when the free layers 262/266 are anti-parallel to pinned later 260. FIG. 6B shows memory cell 254 in an idle state (no voltage bias and at room temperature) when the free layers 262/266 are parallel to pinned later 260. FIG. 6C shows memory cell 250 during a write process to switch the direction of magnetization of free layers 262/266 from parallel to pinned layer 260 to anti-parallel to pinned layer 260. When enough current is applied and device temperature T is high enough to reduce $H_c$ of second free layer 266 to (or close to) zero and its direction of magnetization will change to become in-plane and/or deviate from the perpendicular direction (as depicted by the horizontal arrow 290). At that point net effective $H_c$ of first free layer 262 (through its coupling to second free layer 266) will be reduced and first free layer 262 will switch with lower write current than combined free layers (first free layer 262+second free layer 266) would at lower temperature (in the absence of self-heating). The reduction in write current may be additionally aided due to the now in-plane components of dipolar and/or exchange fields from second free layer 266 on first free layer 262, which can accelerate the dynamics of the STT reversal process of first free layer 262. When current is turned off, the first free layer 262 will be in its direction set by the STT and its dipolar (and/or exchange) coupling with second free layer 266 will align second free layer 266 parallel to its direction. The device will retain its full thermal stability.

Figure 6D:
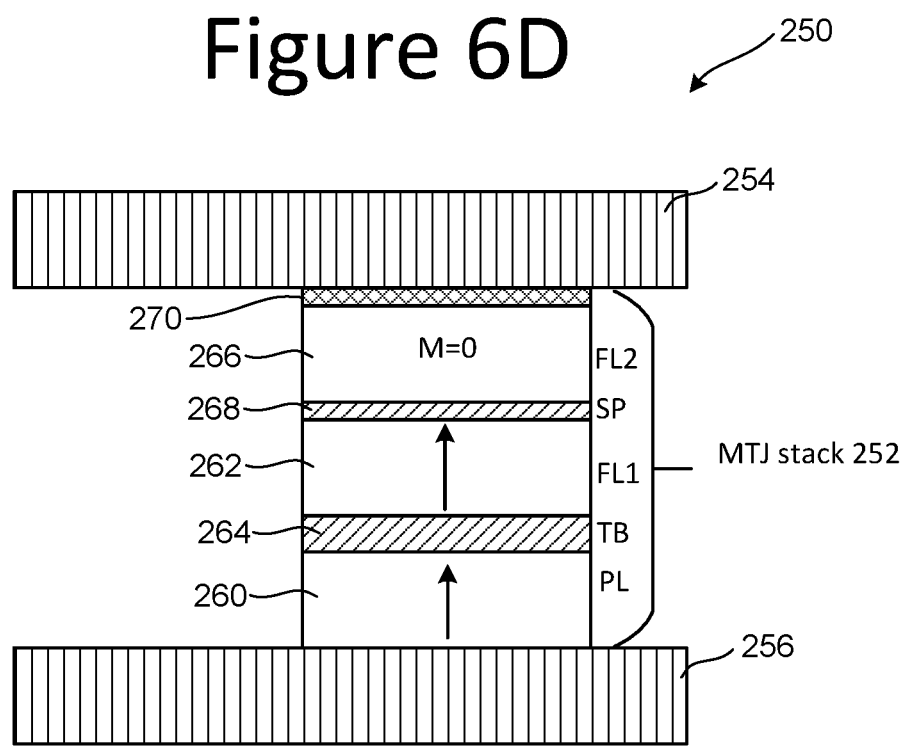
FIG. 6D is a block diagram of a MRAM memory cell.

The embodiment of FIG. 6D depicts a situation where the write current is sufficient to increase device temperature T to exceed the Curie temperature of second free layer 266 such that it becomes unmagnetized. At that point net effective magnetic moment of first free layer 262 will again be reduced and first free layer 262 will switch with lower current than combined free layers (first free layer 262+second free layer 266) would at lower temperature. It is noted that the situation depicted in FIG. 6C regarding the coercivity $H_c \rightarrow 0$ for second free layer 266 would have already occurred in time, but if thermal time constants are sufficiently short compared to magnetization dynamics, the actual switching of first free layer 262 will occur during a period in time when FIG. 6D applies.

Figure 7A:
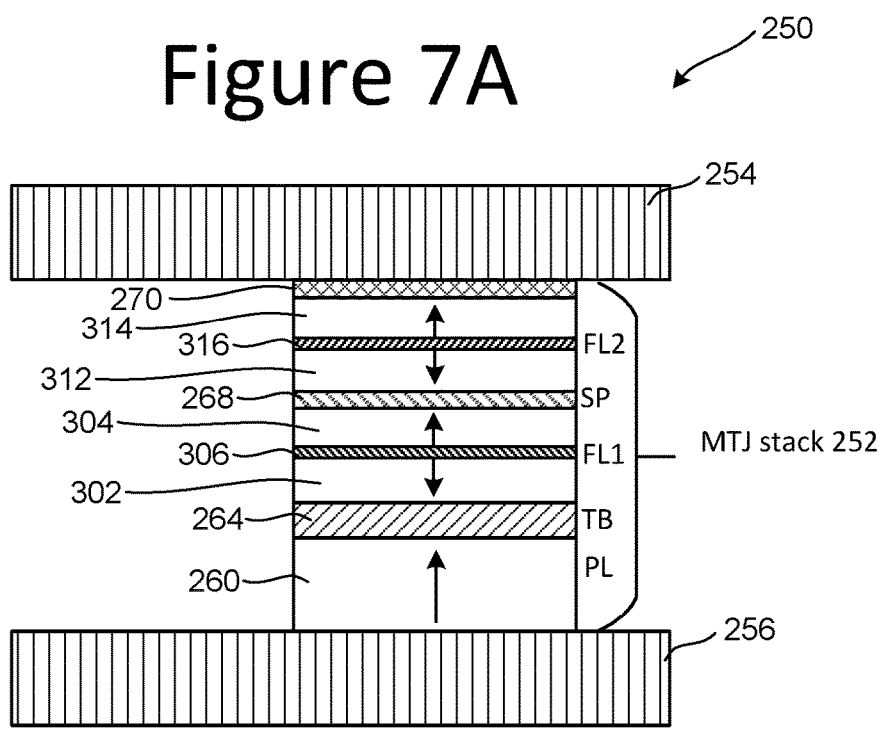
FIG. 7A is a block diagram of a MRAM memory cell.

FIG. 7A depicts an embodiment of STT MRAM memory cell 250 where the first free layer and/or the second free layer is/are comprised of multiple layers. The first free layer can comprise multiple layers separated by one or more spacer layers (e.g., a first set of sub-layers and a first set of spacers between the first set of sub-layers). In the embodiment of FIG. 7A, the first free layer comprises sub-layer 302, sub-layer 304 and spacer layer 306 between sub-layer 302 and sub-layer 304. The sub-layers of the first free layer can be any of the materials discussed above for forming the first free layer.

The second free layer can comprise multiple layers separated by one or more spacer layers (e.g., a second set of sub-layers and a second set of spacers between the second set of sub-layers). In the embodiment of FIG. 7A, the second free layer comprises sub-layer 312, sub-layer 314 and spacer layer 316 between sub-layer 312 and sub-layer 314. The sub-layers of the second free layer can be any of the materials discussed above for forming the first free layer.

Figure 7B:
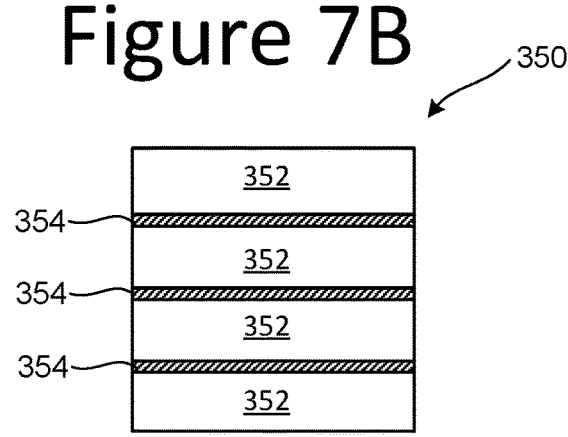
FIG. 7B is a block diagram of a free layer for a MRAM memory cell.
Figure 7C:
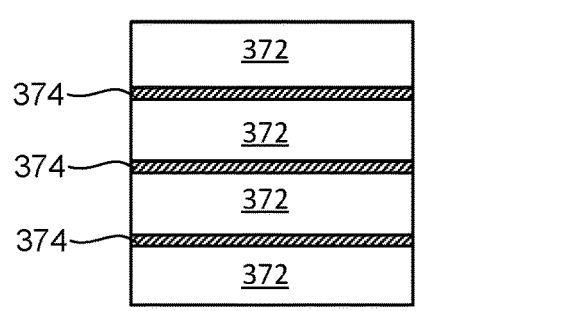
FIG. 7C is a block diagram of a free layer for a MRAM memory cell.

Figured 7A shows the first free layer having two sub-layers separated by a spacer layer and the second free layer having two sublayers separated by a spacer layer. However, in other embodiments, the first free layer and/or the second free layer can have more than two sub-layers. For example, FIG. 7B shows another example of a first free layer 350 that includes four sub-layers 352 separated by spacer layers 354 and FIG. 7C shows an example of a second free layer 370 that includes four sub-layers 372 separated by spacer layers 374. In other embodiments, more than four sub-layers can be used. In one embodiment, all of the sub-layers for a free layer comprise the same materials. In another embodiment, some or all of the sub-layers for a free layer comprise different materials.

As explained above, in one embodiment, temperature dependence of coercivity $$\left|\frac{dH_c}{dT}\right|$$

of the second free layer is larger than $$\left| \frac{dH_c}{dT} \right|$$

of the first free layer. In one embodiment, this condition is created by using specific different materials in the second free layer as compared to the first free layer. The difference in temperature dependence of coercivity can also be established by using different materials for the spacers in the second free layers as compared to the first free layer. For example, spacer layer 316 of FIG. 7A or spacer layers 374 of FIG. 7C can be made of Tantalum, while spacer layer 306 of FIG. 7A or spacer layers 354 of FIG. 7B can be made of Tungsten. Using different materials for the spacers in the second free layers as compared to the first free layer can cause a difference in temperature dependence of coercivity for embodiments where the first free layer is made of different materials then the second free layer and in embodiments where the first free layer is made of the same materials as the second free layer. In another embodiment, temperature dependence of coercivity of the second free layer is greater than temperature dependence of coercivity of the first free layer because the second free layer has more sub-layers and more spacer layers than the first free layers. The additional sub-layers and spacer layers create additional interfaces inside the second free layer that increases temperature dependence of coercivity of the second free layer.

As discussed above, running a current through the MTJ stack causes Joule heating of the MTJ and the resultant temperature increase is used to aid the switching. In one embodiment, to maintain the temperature rise, the memory cell includes thermal barriers on the top and/or bottom of the MTJ. For example, FIG. 8 shows an embodiment of a STT MRAM memory cell 400 that includes MTJ stack 402 between conductor 404 and conductor 406. MTJ stack includes pinned layer 260, first free layer 262, tunnel barrier 264, second free layer 266 and cap layer 270 as discussed above. Adjacent and between pinned layer 260 and conductor 406, is thermal barrier layer 410. Adjacent and between cap layer 270 and conductor 404, is thermal barrier layer 412. Thermal barriers 410 and 412 help prevent the Joule heating described from diffusing away (vertically in this case) from the memory cell. If the heat is otherwise able to dissipate prior to the time required for switching, then the self-induced heat would not as efficiently help the switching as described above. In one embodiment, the thermal barriers 410 and 412 are made of TaN, TiN, MgO/Ru multilayer, CN or similar materials with low thermal conductivity and high electrical conductivity in order to preserve the heat generated in the barrier junctions while not adding much parasitic resistance. In another embodiment, the thermal barriers 410 and 412 are made of amorphous semiconductors or threshold switch materials. The threshold switch materials can be transitional metal oxides like niobium oxide or vanadium oxide. The threshold switch materials can be ovonic threshold switches containing chalcogenide materials composed of alloys of S, Se, and/or Te alloyed with Si, Ge, Sn, P, As, and/or Sb, and may be doped with B, C, N, O, and/or In. The chalcogenide materials can be layer to form multilayers of different alternating compositions. The multilayers can include repetitions of the same ovonic threshold switch material separated by a different ovonic threshold switch material or different semiconducting or insulating material, such as Si, SiN, SiC, TaO$_2$, SiO$_2$ or Al$_2$O$_3$. The layer thicknesses can range from 0.1 nm to 10 nm. In some embodiments, the memory cell only includes one of the thermal barriers depicted in FIG. 8.

Figure 9:
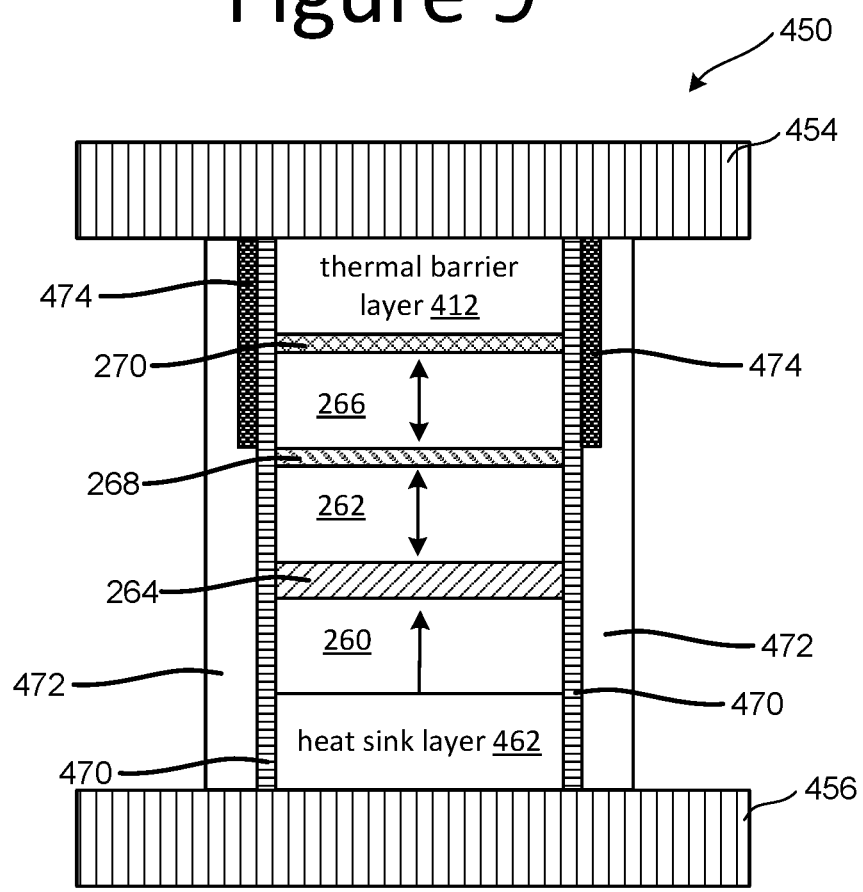
FIG. 9 is a block diagram of a MRAM memory cell.

FIG. 9 depicts another embodiment of a STT MRAM memory cell 450 that includes structure for maintaining the self-induced heat. Memory cell 450 includes pinned layer 260, first free layer 262, tunnel barrier 264, second free layer 266 and cap layer 270 as discussed above. Adjacent and between pinned layer 260 and conductor 456, is heat sink layer 470. Adjacent and between cap layer 270 and conductor 454, is thermal barrier layer 412. Thermal barrier layer 412 is closer to the second free layer than to the first free layer while heat sink layer 462 is closer to the first free layer than to the second free layer. Heat sink layer 462, made of copper or copper nitrate, serves to dissipate heat near first free layer 262. In this manner, heat sink layer 470 in combination with thermal barrier layer 412 serve to confine heat near second free layer 266 and reduce heating (i.e., temperature rise) of first free layer 262. Reducing the heating of first free layer 262 prevents the lowering of the breakdown voltage for the tunnel barrier and maintains a high TMR for first free layer 262.

Memory cell 450 also includes a fill 470 surrounding the edge of the memory cell. In one embodiment, layers 260-270, 412 and 462 are circular such that the MTJ stack is in the shape of a cylinder and fill 470 surrounds the cylinder. Surrounding fill 470 is liner 472. In one embodiment, liner 472 comprises dielectric materials such as SiN, SiC, TaO$_2$, SiO$_2$ or Al$_2$O$_3$, picked to improve process robustness. In one embodiment, fill 470 also comprises a dielectric material such as SiN, TaO$_2$, SiO$_2$ or Al$_2$O$_3$. Fill 470 can be the same materials as liner 472 or different materials than liner 472. Fill 470 serves to passivate the sidewalls (ie protect the MTJ without damaging it).

Memory cell 450 also includes thermal barrier liner 474 that surrounds fill 470 adjacent to second free layer 266, cap layer 270 and thermal barrier layer 412 such that thermal barrier liner 474 surrounds the second free layer 266 and cap layer 270. Thermal barrier liner 474 is positioned between fill 470 and liner 472. In one embodiment, thermal barrier liner 474 does not surround first free layer 262 and pinned layer 260 so that thermal barrier liner 474 serves to confine/maintain the heat at second free layer 266 (reduces lateral heat dissipation) but does not confine/maintain the heat at first free layer 262. In this manner, the thermal barrier liner is positioned on a side of the MTJ stack and is adjacent the second free layer without being adjacent the first free layer. In another embodiment, thermal barrier liner 474 can extend down the MTJ stack such that it surrounds pinned layer 260, first free layer 262, tunnel barrier 264, second free layer 266 and cap layer 270. Thermal barrier liner can be made from chalcogenide materials composed of alloys of S, Se, and/or Te alloyed with Si, Ge, Sn, P, As, and/or Sb, and may be doped with B, C, N, O, and/or In. The chalcogenide materials can be layer to form multilayers of different alternating compositions. The multilayers can include repetitions of the same ovonic threshold switch material separated by different ovonic threshold switch materials or a different semiconducting or insulating material, such as Si, SiN, SiC, TaO$_2$, SiO$_2$ or Al$_2$O$_3$. The layer thicknesses can range from 0.1 nm to 10 nm.

Figure 10:
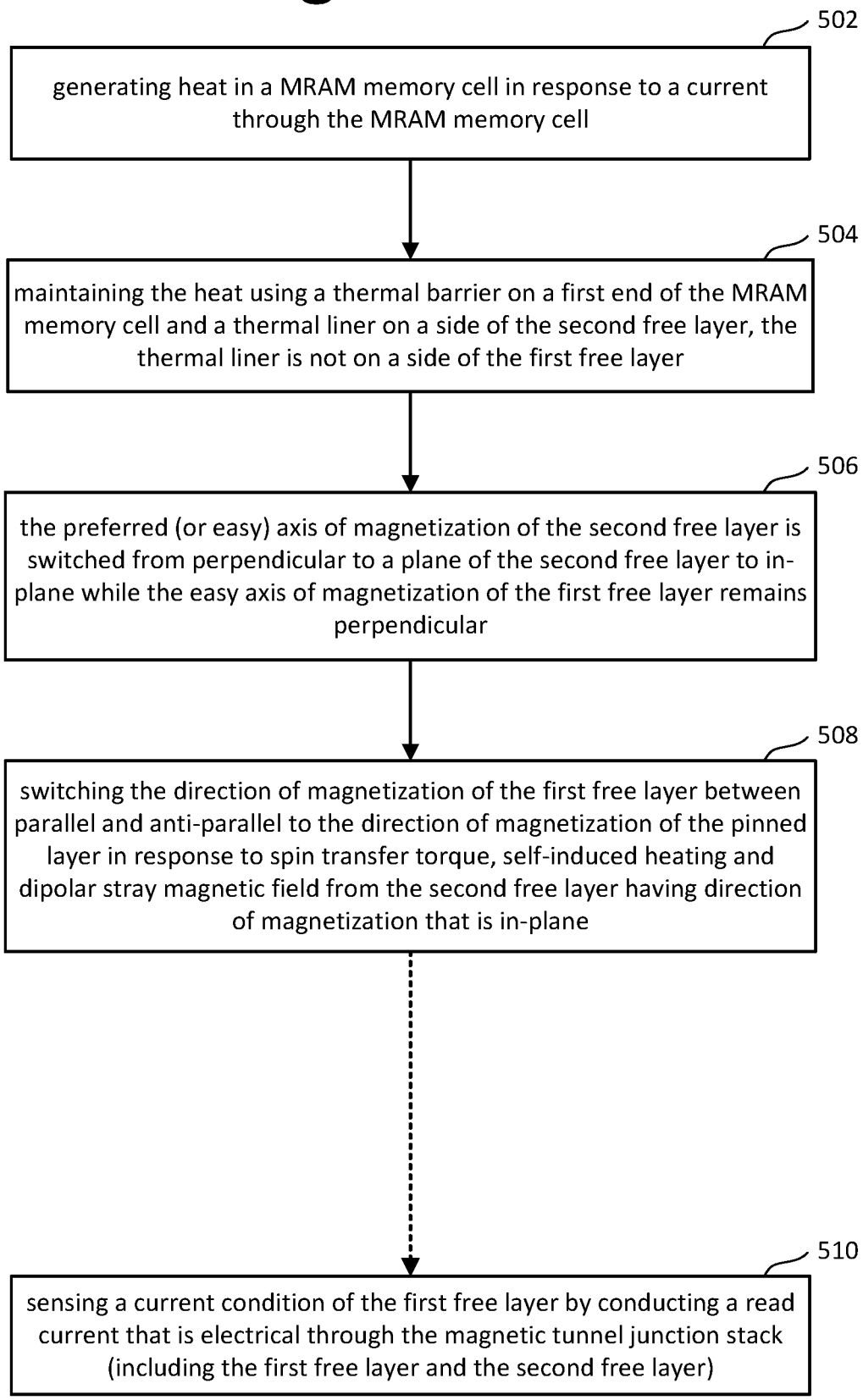
FIG. 10 is a flow chart describing one embodiment of a process for operating a MRAM memory cell.

FIG. 10 is a flow chart describing one embodiment of a process for operating the MRAM memory cells of FIGS. 4-9. In step 502, heat is generated in the MRAM memory cell in response to a current through the MRAM memory cell. This is the self-induced heat described above, due to the current through the cap layer and the tunnel barrier (e.g., current 280 or current 282). In step 504 (optional), the heat generated in step 502 is maintained using a thermal barrier on a first end of the MRAM memory cell and a thermal liner on a side of the second free layer. The thermal liner is not on a side of the first free layer. In step 506, in response to the heat, the preferred (or easy) axis of magnetization of the second free layer is switched from perpendicular to a plane of the second free layer to in-plane while the easy axis of magnetization of the first free layer remains perpendicular. In step 508, the direction of magnetization of the first free layer is switched between parallel and anti-parallel to the direction of magnetization of the pinned layer in response to spin transfer torque, self-induced heating and dipolar and/or exchange magnetic field from the second free layer having direction of magnetization that is (substantially) in-plane. In step 510, a read operation is performed, including sensing a current condition of the first free layer by conducting a read current that is electrical (e.g., read current 284 of FIG. 5C) through the magnetic tunnel junction stack (including the first free layer and the second free layer). Step 510 is depicted further from step 508 and connected by a dashed line to indicate that read process can be performed much later in time (and not necessarily sequential) than the write process (e.g., step 502-508).

Figure 11:
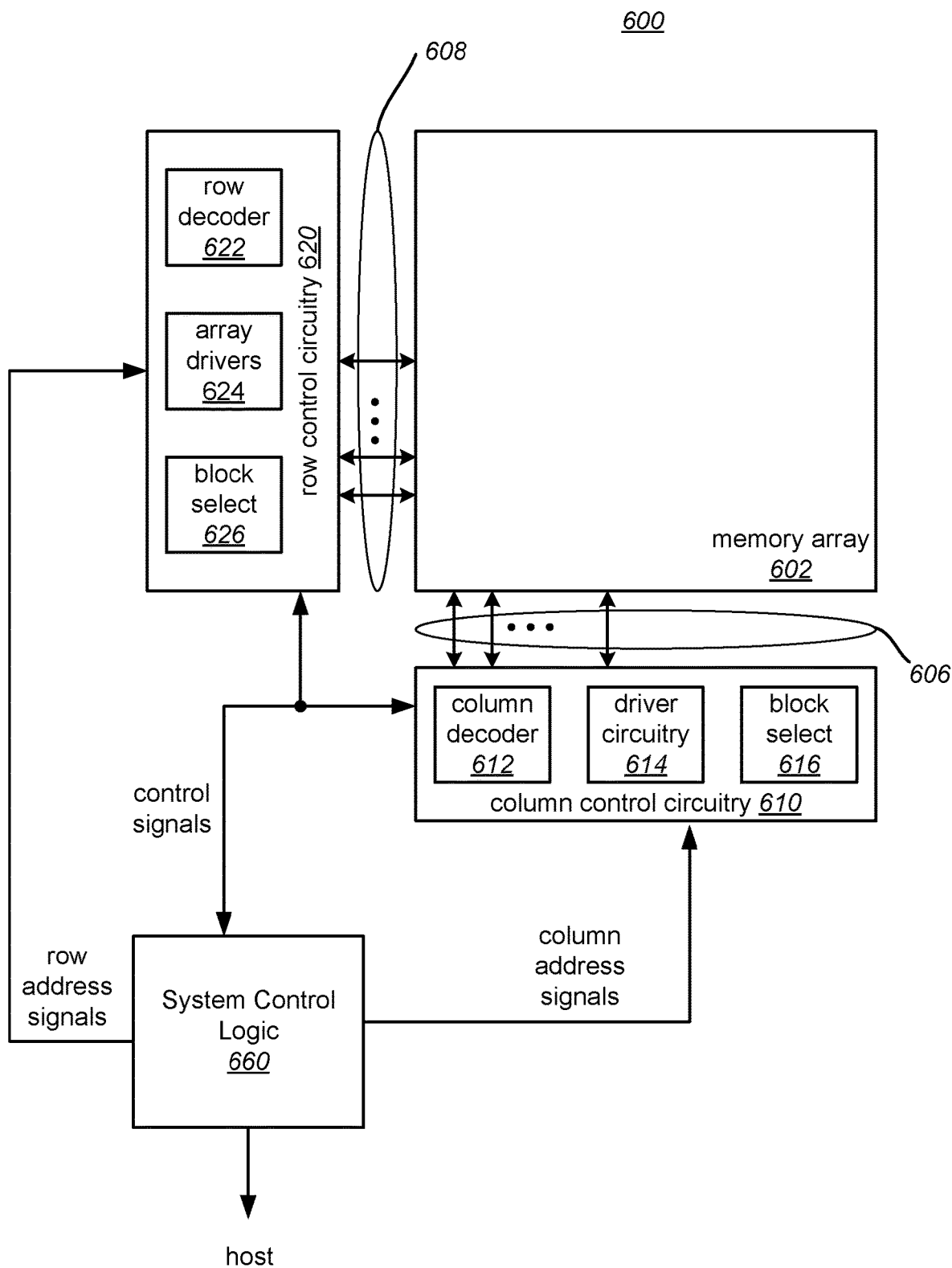
FIG. 11 is a block diagram of a memory system using the new memory cell proposed herein.

FIG. 11 is a block diagram that depicts one example of a memory system 600 that can implement the technology described herein, including performing the process of FIG. 10. Memory system 600 includes a memory array 602 that can include any of memory cells described above. The array terminal lines of memory array 602 include the various layer(s) of word lines organized as rows, and the various layer(s) of bit lines organized as columns. However, other orientations can also be implemented. Memory system 600 includes row control circuitry 620, whose outputs 608 are connected to respective word lines of the memory array 602. Row control circuitry 620 receives a group of M row address signals and one or more various control signals from System Control Logic circuit 660, and typically may include such circuits as row decoders 622, array terminal drivers 624, and block select circuitry 626 for both reading and writing operations. Memory system 600 also includes column control circuitry 610 whose input/outputs 606 are connected to respective bit lines of the memory array 602. Column control circuitry 606 receives a group of N column address signals and one or more various control signals from System Control Logic 660, and typically may include such circuits as column decoders 612, array terminal receivers or drivers 614, block select circuitry 616, as well as read/write circuitry, and I/O multiplexers. System control logic 660 receives data and commands from a host and provides output data and status to the host. In other embodiments, system control logic 660 receives data and commands from a separate controller circuit and provides output data to that controller circuit, with the controller circuit communicating with the host. System control logic 660 may include one or more state machines, registers and other control logic for controlling the operation of memory system 600.

In one embodiment, all of the components depicted in FIG. 11 are arranged on a single integrated circuit. For example, system control logic 660, column control circuitry 610 and row control circuitry 620 are formed on the surface of a substrate and memory array 602 is formed one or above the substrate.

The above-described embodiments provide for a transfer torque MRAM memory cell has a lower switching current and an increased write margin due to self-heating. The lower current allows the memory cell to operate more efficiently, with less power and with smaller transistors (which enable an increase in density). Also, using a lower write current decrease device degradation over time. The increased write margin allows the memory cell to improve endurance and reliability.

One embodiment includes a non-volatile memory apparatus comprising a pinned layer having fixed direction of magnetization that is perpendicular to a plane of the pinned layer, a first free layer having a perpendicular easy-axis of magnetization, and a (perpendicular) direction of magnetization that can be switched and is perpendicular to a plane of the first free layer, a tunnel barrier positioned between the pinned layer and the first free layer, a second free layer having a direction of magnetization that can be switched, and a spacer layer positioned between the first free layer and the second free layer. Temperature dependence of coercivity of the second free layer is greater than temperature dependence of coercivity of the first free layer.

In one example implementation, the second free layer is configured such that direction of easy axis of magnetization of the second free layer is changed from perpendicular to in-plane in response to self-heating. In another example implementation, the second free layer is configured such that the second free layer is changed to non-magnetic in response to the heat.

One embodiment includes a method of operating non-volatile memory apparatus comprising generating heat in a MRAM memory cell in response to a current through the MRAM memory cell. The MRAM memory cell includes a pinned layer having fixed direction of magnetization that is perpendicular to a plane of the pinned layer, a first free layer and a second free layer. The first free layer has a perpendicular easy axis of magnetization, and a (perpendicular) direction of magnetization that can be switched and is perpendicular to a plane of the first free layer. The second free layer has a direction of magnetization that can be switched. The method further includes, in response to self-heating, switching the easy axis of magnetization of the second free layer from perpendicular to the plane of the second free layer to in-plane while the easy axis of magnetization of the first free layer remains perpendicular to the plane of the first free layer and the direction of magnetization of the first free layer is switched between parallel and anti-parallel to the direction of magnetization of the pinned layer in response to a dipolar stray magnetic field (and possibly exchange coupling) from the second free layer with in-plane direction of magnetization.

One embodiment includes a non-volatile memory apparatus comprising a pinned layer having fixed direction of magnetization that is perpendicular to a plane of the pinned layer, a first free layer having a direction of magnetization that can be switched and is perpendicular to a plane of the first free layer, a tunnel barrier positioned between the pinned layer and the first free layer, a second free layer having a direction of magnetization that can be switched, a spacer layer positioned between the first free layer and the second free layer, and a cap layer adjacent the second free layer. The direction of magnetization of the second free layer is perpendicular to a plane of the second free layer if no current bias is applied across the non-volatile memory apparatus. The second free layer is configured such that direction of magnetization of the second free layer is changed from perpendicular to a plane of the second free layer if a current is applied though the tunnel barrier and the cap layer. The first free layer is configured such that switching of the direction of magnetization of the first free layer occurs in response to spin transfer torque, self-induced heating and a dipolar stray magnetic field from the second free layer having direction of magnetization that is different from perpendicular to the plane of the second free layer (e.g., in plane).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory apparatus, comprising:
a pinned layer having a fixed direction of magnetization that is perpendicular to a plane of the pinned layer;
a first free layer having a direction of magnetization that can be switched and is perpendicular to a plane of the first free layer;
a tunnel barrier positioned between the pinned layer and the first free layer, the tunnel barrier is configured to generate heat in response to a current through the tunnel barrier;
a second free layer having a direction of magnetization that can be switched, temperature dependence of coercivity of the second free layer is larger than temperature dependence of coercivity of the first free layer, temperature of the second free layer increases in response to the heat, the second free layer is configured to become unmagnetized in response to temperature of the second free layer exceeding a threshold temperature; and
a spacer layer positioned between the first free layer and the second free layer.

2. A non-volatile memory apparatus, comprising:
a pinned layer having a fixed direction of magnetization that is perpendicular to a plane of the pinned layer;
a first free layer having a direction of magnetization that can be switched and is perpendicular to a plane of the first free layer;
a tunnel barrier positioned between the pinned layer and the first free layer, the tunnel barrier is configured to generate heat in response to a current through the tunnel barrier;
a second free layer having a direction of magnetization that can be switched, temperature dependence of coercivity of the second free layer is larger than temperature dependence of coercivity of the first free layer; and
a spacer layer positioned between the first free layer and the second free layer, the second free layer is configured such that preferred (easy) axis of magnetization of the second free layer is changed from perpendicular to a plane of the second free layer to in-plane in response to the heat while the preferred (easy) axis of magnetization of the first free layer remains perpendicular to the plane of the first free layer.

3. The non-volatile memory apparatus of claim 2, further comprising:
a cap layer adjacent the second free layer, the cap layer and the tunnel barrier are configured to generate the heat in response to a current through the cap layer and the tunnel barrier.

4. The non-volatile memory apparatus of claim 2, wherein:
the first free layer is configured to switch direction of magnetization between parallel and anti-parallel to the direction of magnetization of the pinned layer in response to a dipolar stray magnetic field from the second free layer having in-plane direction of magnetization.

5. The non-volatile memory apparatus of claim 2, further comprising:
a cap layer adjacent the second free layer, the cap layer and the tunnel barrier are configured to generate the heat in response to a current through the cap layer and the tunnel barrier; and
the first free layer is configured to switch direction of magnetization between parallel and anti-parallel to the direction of magnetization of the pinned layer in response to spin transfer torque, self-induced heating and dipolar stray magnetic field from the second free layer having in-plane direction of magnetization and/or exchange coupling between the second free layer having in-plane direction of magnetization and the first free layer.

6. The non-volatile memory apparatus of claim 2, wherein:
the first free layer comprises a first set of sub-layers and a first set of spacers between the first set of sub-layers; and
the second free layer comprises a second set of sub-layers and a second set of spacers between the second set of sub-layers; and
the first set of spacers is different than the second set of spacers, which causes the temperature dependence of coercivity of the second free layer to be greater than the temperature dependence of coercivity of the first free layer.

7. The non-volatile memory apparatus of claim 2, further comprising:
a first thermal barrier and a second thermal barrier;
wherein the first free layer, the second free layer, the tunnel barrier and the spacer layer form a stack; and wherein the first thermal barrier is at a first end of the stack and the second thermal barrier is at a second end of the stack.

8. The non-volatile memory apparatus of claim 2, further comprising:
a thermal barrier and a heat sink layer;
wherein the first free layer, the second free layer, the tunnel barrier and the spacer layer form a stack;
wherein the thermal barrier is at a first end of the stack that is closer to the second free layer than to the first free layer; and
wherein the heat sink layer is at a second end of the stack that is closer to the first free layer than to the second free layer.

9. The non-volatile memory apparatus of claim 8, further comprising:
a thermal barrier liner on a side of the stack, between the first end and the second end.

10. The non-volatile memory apparatus of claim 2, further comprising:
a thermal barrier liner;
wherein the first free layer, the second free layer, the tunnel barrier and the spacer layer form a stack; and
wherein the thermal barrier liner is positioned on a side of the stack and is adjacent the second free layer without being adjacent the first free layer.

11. A method of operating non-volatile memory apparatus, comprising:
generating heat in a MRAM memory cell in response to a current through the MRAM memory cell, the MRAM memory cell including a pinned layer having fixed direction of magnetization that is perpendicular to a plane of the pinned layer, the MRAM memory cell including a first free layer and a second free layer, the first free layer has a direction of magnetization that can be switched and is perpendicular to a plane of the first free layer, the second free layer has a direction of magnetization that can be switched;
in response to the heat, switching the preferred (easy) axis of magnetization of the second free layer from perpendicular to a plane of the second free layer to in-plane while the preferred (easy)axis of magnetization of the first free layer remains perpendicular to the plane of the first free layer; and
switching the direction of magnetization of the first free layer between parallel and anti-parallel to the direction of magnetization of the pinned layer in response to a dipolar stray magnetic field from the second free layer having in-plane direction of magnetization or exchange coupling between the second free layer having in-plane direction of magnetization and the first free layer.

12. The method of claim 11, further comprising:
maintaining the heat using a thermal barrier on a first end of the MRAM memory cell and a thermal liner surrounding the second free layer, the thermal liner is not surrounding the first free layer.

13. The method of claim 11, wherein:
temperature dependence of coercivity of the second free layer is greater than temperature dependence of coercivity of the first free layer.

14. The method of claim 13, wherein:
the first free layer comprises a first set of sub-layers and a first set of spacers between the first set of sub-layers; and
the second free layer comprises a second set of sub-layers and a second set of spacers between the second set of sub-layers; and the first set of spacers is different than the second set of spacers, which causes the temperature dependence of coercivity of the second free layer to be greater than the temperature dependence of coercivity of the first free layer.

15. A non-volatile memory apparatus, comprising:
a pinned layer having fixed direction of magnetization that is perpendicular to a plane of the pinned layer;
a first free layer having a direction of magnetization that can be switched and is perpendicular to a plane of the first free layer;
a tunnel barrier positioned between the pinned layer and the first free layer;
a second free layer having a direction of magnetization that can be switched;
a spacer layer positioned between the first free layer and the second free layer; and
a cap layer adjacent the second free layer;
direction of magnetization of the second free layer is perpendicular to a plane of the second free layer if no current bias is applied across the non-volatile memory apparatus;
the second free layer is configured such that a preferred (easy) axis of magnetization of the second free layer is changed from perpendicular to a plane of the second free layer if a current is applied though the tunnel barrier and the cap layer;
the first free layer is configured such that switching of the direction of magnetization of the first free layer occurs in response to spin transfer torque, self-induced heating and dipolar stray magnetic field from the second free layer having in-plane direction of magnetization.

16. The non-volatile memory apparatus of claim 15, wherein:
the second free layer is configured such that preferred (easy) axis of magnetization of the second free layer is changed from perpendicular to the plane of the second free layer to in-plane if a current is applied though the tunnel barrier and the cap layer.

17. The non-volatile memory apparatus of claim 15, wherein:
The temperature dependence of coercivity of the second free layer is larger than temperature dependence of coercivity of the first free layer;
the first free layer comprises a first set of sub-layers and a first set of spacers between the first set of sub-layers; and
the second free layer comprises a second set of sub-layers and a second set of spacers between the second set of sub-layers; and
the first set of spacers is different than the second set of spacers, which causes the temperature dependence of coercivity of the second free layer to be greater than the temperature dependence of coercivity of the first free layer.

18. The non-volatile memory apparatus of claim 15, further comprising:
a thermal barrier liner;
wherein the first free layer, the second free layer, the tunnel barrier, the spacer layer and the cap layer form a stack;
wherein the thermal barrier liner a portion of the stack adjacent to the second free layer without being adjacent the first free layer.

* * * * *